US012609281B2

(12) United States Patent
Seon

(10) Patent No.: US 12,609,281 B2
(45) Date of Patent: Apr. 21, 2026

(54) FILAMENT ALIGNMENT DEVICE

(71) Applicant: Samsung Electronics Co., Ltd.,
Suwon-si (KR)

(72) Inventor: Sangwoo Seon, Suwon-si (KR)

(73) Assignee: SAMSUNG ELECTRONICS CO.,
LTD., Suwon-si (KR)

( * ) Notice: Subject to any disclaimer, the term of this
patent is extended or adjusted under 35
U.S.C. 154(b) by 370 days.

(21) Appl. No.: 18/383,237

(22) Filed: Oct. 24, 2023

(65) Prior Publication Data

US 2024/0153740 A1    May 9, 2024

(30) Foreign Application Priority Data

Nov. 4, 2022    (KR) ........................ 10-2022-0146401
Jan. 5, 2023    (KR) ........................ 10-2023-0001949

(51) Int. Cl.
*H01J 37/317*        (2006.01)
*H01J 37/02*         (2006.01)
*H01J 37/065*        (2006.01)
*H01J 37/08*         (2006.01)
*H01J 37/32*         (2006.01)

(52) U.S. Cl.
CPC ........ *H01J 37/3172* (2013.01); *H01J 37/026*
(2013.01); *H01J 37/065* (2013.01); *H01J*
*37/08* (2013.01); *H01J 37/32412* (2013.01)

(58) Field of Classification Search
CPC ........ H01J 37/06; H01J 37/065; H01J 37/026;
H01J 37/08; H01J 37/3172; H01J
37/32412
See application file for complete search history.

(56) References Cited

U.S. PATENT DOCUMENTS

| | | | |
|---|---|---|---|
| 3,997,807 A | 12/1976 | Riddle et al. | |
| 5,936,251 A | 8/1999 | Gierak et al. | |
| 7,402,816 B2 | 7/2008 | Renau et al. | |
| 7,855,373 B2 | 12/2010 | Zhang | |
| 8,095,037 B2 * | 1/2012 | Onuma .............. | G03G 15/0258 |
| | | | 250/326 |
| 9,117,623 B1 | 8/2015 | Borges et al. | |
| 10,790,112 B2 | 9/2020 | Kawanami | |

FOREIGN PATENT DOCUMENTS

| | | | |
|---|---|---|---|
| CN | 101019201 A | | 8/2007 |
| JP | 2009099433 A | * | 5/2009 |
| KR | 10-2004-0005402 A | | 1/2004 |

(Continued)

*Primary Examiner* — David E Smith
(74) *Attorney, Agent, or Firm* — Muir Patent Law, PLLC

(57) ABSTRACT

A filament alignment device for accommodating a PFG
including a support plate, an insulator on the support plate,
and a filament at an end portion of the insulator includes a
main case having a first plate groove into which a first
portion of the support plate is inserted and an open side
surface, an auxiliary case for covering at least a first area of
the open side surface of the main case and having a second
plate groove into which a second portion of the support plate
is inserted, a height adjuster including a height controller on
an upper sidewall of the main case and a fixing hook
provided on an end portion of the height controller and
which the filament is hung, and a hinge for rotatably
connecting a sidewall of the auxiliary case to a sidewall of
the main case.

20 Claims, 12 Drawing Sheets

(56)          References Cited

FOREIGN PATENT DOCUMENTS

| | | | |
|----|----|----|----|
| KR | 10-2004-0010873 | A | 2/2004 |
| KR | 10-0485643 | B1 | 4/2005 |
| KR | 10-2005-0102435 | A | 10/2005 |
| KR | 20050102435 | A * | 10/2005 |
| KR | 10-2006-0019301 | A | 3/2006 |
| TW | 200620372 | A | 6/2006 |
| TW | 201621967 | A | 6/2016 |
| TW | 201837957 | A | 10/2018 |
| WO | 9602065 | A1 | 1/1996 |

* cited by examiner

FILAMENT ALIGNMENT DEVICE

CROSS-REFERENCE TO RELATED APPLICATION

This application is based on and claims priority under 35 U.S.C. § 119 to Korean Patent Application Nos. 10-2022-0146401, filed on Nov. 4, 2022, and 10-2023-0001949, filed on Jan. 5, 2023, in the Korean Intellectual Property Office, the disclosures of which are incorporated by reference herein in their entirety.

BACKGROUND

Aspects of the inventive concept relate to a filament alignment device, and more particularly, to a filament alignment device for a plasma flood gun (PFG).

The ion implantation technology is one of the process technologies for introducing impurities onto a wafer along with thermal diffusion technology in manufacturing semiconductor devices. An ion implantation apparatus is equipped with a PFG. The PFG generates a large number of electrons in the apparatus and emits the electrons toward a positive ion beam. An arcing occurring on the wafer, which is a drawback of the positive ion beam, is reduced or prevented by the PFG and the space charge of the ion beam is remedied by the PFG.

SUMMARY

Aspects of the inventive concept provide a filament alignment device for installing a filament to a PFG by fixing the PFG and precisely setting a height of the filament.

The problems to be solved by the aspects of inventive concept are not limited to the above-described problems, and some other problems are clearly understood by one of ordinary skill in the art from the following descriptions hereinafter.

According to an aspect of the inventive concept, there is provided a filament alignment device for accommodating a plasma flood gun (PFG) including a support plate, an insulator on the support plate, and a filament installed at an end portion of the insulator. The filament alignment device may include a main case having, in a sidewall, a first plate groove into which a first portion of the support plate is inserted, and an open side surface, an auxiliary case covering at least a first area of the open side surface of the main case, and having, in a sidewall, a second plate groove into which a second portion of the support plate is inserted, a height adjuster including a height controller arranged on an upper sidewall of the main case and a fixing hook that is provided on an end portion of the height controller and on which the filament is hung, and a hinge rotatably connecting the sidewall of the auxiliary case with the sidewall of the main case, such that the auxiliary case is opened and closed with respect to the main case.

According to another aspect of the inventive concept, there is provided a filament alignment device for accommodating a plasma flood gun (PFG) including a support plate, an insulator on the support plate, and a filament installed at an end portion of the insulator. The filament alignment device may include a main case having, in a sidewall, a first plate groove into which a first portion of the support plate is inserted, and an open side surface, an auxiliary case covering at least a first area of the open side surface of the main case, and having, in a sidewall, a second plate groove into which a second portion of the support plate is inserted, and a height adjuster including a height controller penetrating through an upper sidewall of the main case and a fixing hook that is provided on an end portion of the height controller and on which the filament is hung. A first guide key may be provided on each of two opposite sidewalls of the main case, and a second guide key, which is complementarily engaged with the first guide key, may be provided on each of two opposite sidewalls of the auxiliary case.

According to another aspect of the inventive concept, there is provided a filament alignment device for accommodating a plasma flood gun (PFG) including a support plate, an insulator on the support plate, and a filament installed at an end portion of the insulator. The filament alignment device may include a main case having, in a sidewall, a first plate groove into which a first portion of the support plate is inserted and a first guide key on an open side surface, an auxiliary case covering at least a first area of the open side surface of the main case, having, in a sidewall, a second plate groove into which a second portion of the support plate is inserted and a second guide key complementarily engaged with the first guide key, a height adjuster including a micrometer on an upper sidewall of the main case, a magnet attached to an end portion of the micrometer by a magnetic force, and a fixing hook attached to the magnet by a magnetic force and on which the filament is hung, the fixing hook rotating independently from a rotation of the micrometer, and a hinge rotatably connecting the sidewall of the auxiliary case with the sidewall of the main case, such that the auxiliary case is opened and closed with respect to the main case. The first plate grooves may be provided on each of two opposite sidewalls of the main case, and the second plate grooves may be provided on each of two opposite sidewalls of the auxiliary case.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
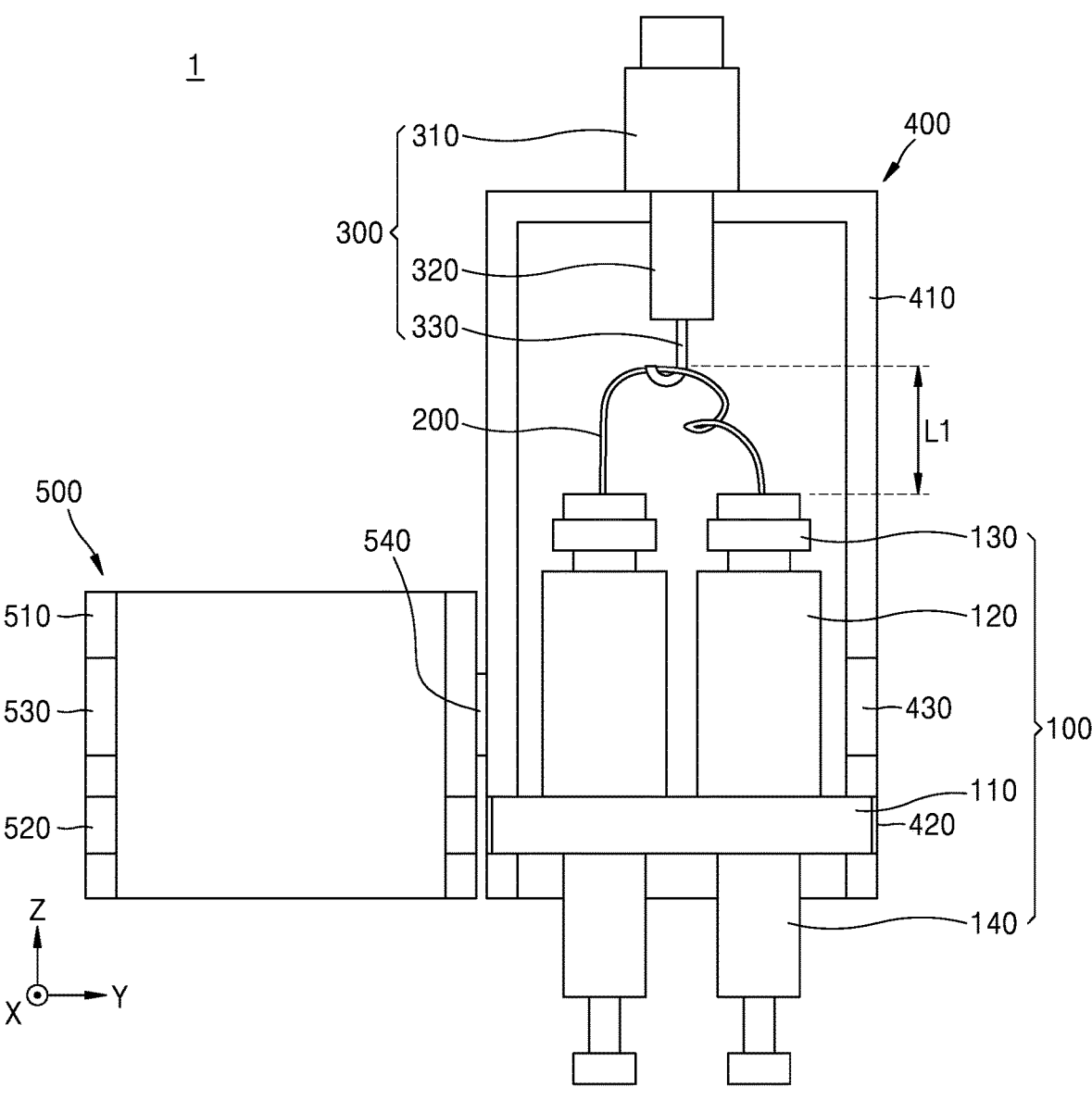
FIG. 1 is a view illustrating a filament alignment device with an open auxiliary case body, according to an embodiment.

Hereinafter, embodiments of the technical idea of the inventive concept are described in detail with reference to the accompanying drawings. The same reference numerals denote the same elements in the drawings, and the descriptions on the same elements are omitted.

Figure 2:
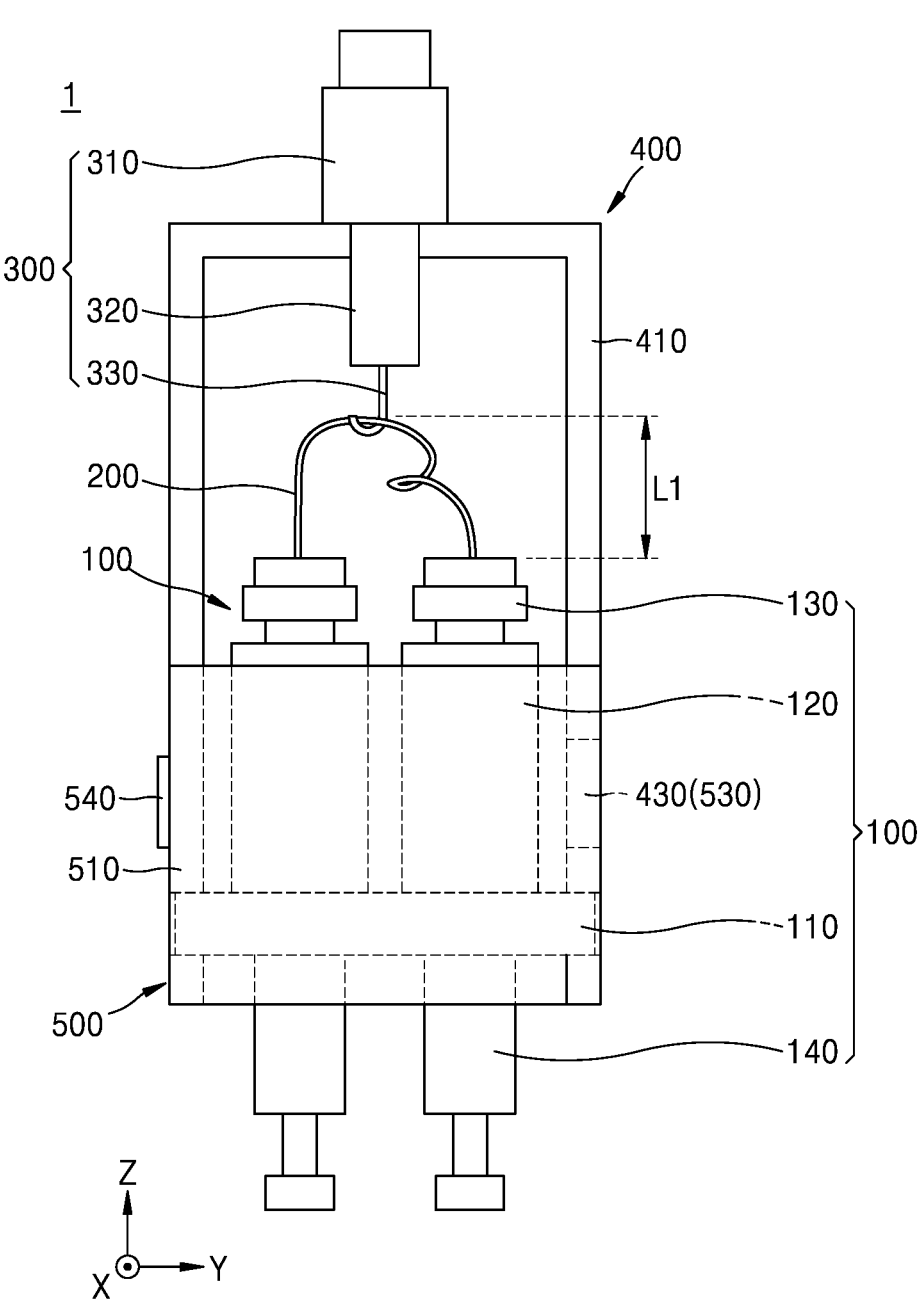
FIG. 2 is a view illustrating a filament alignment device with a closed auxiliary case body, according to an embodiment.
Figure 3:
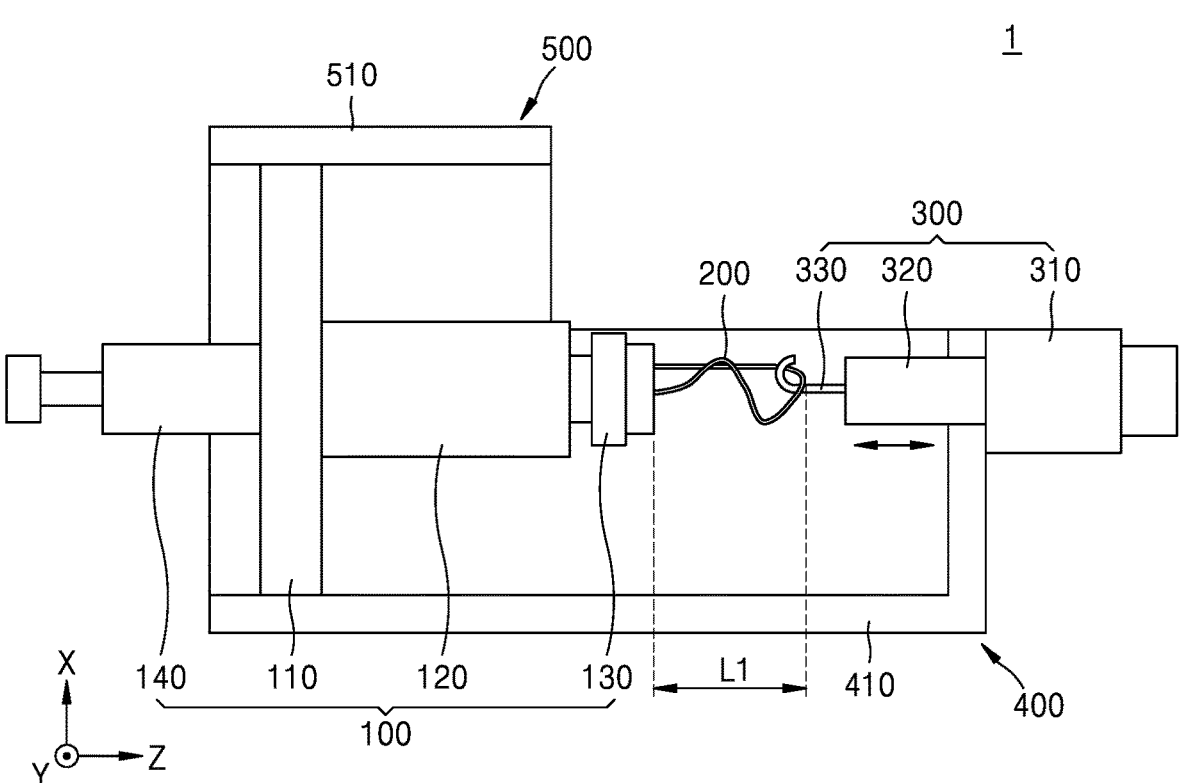
FIG. 3 is a side cross-sectional view illustrating a filament alignment device with a closed auxiliary case body, according to an embodiment.
Figure 4:
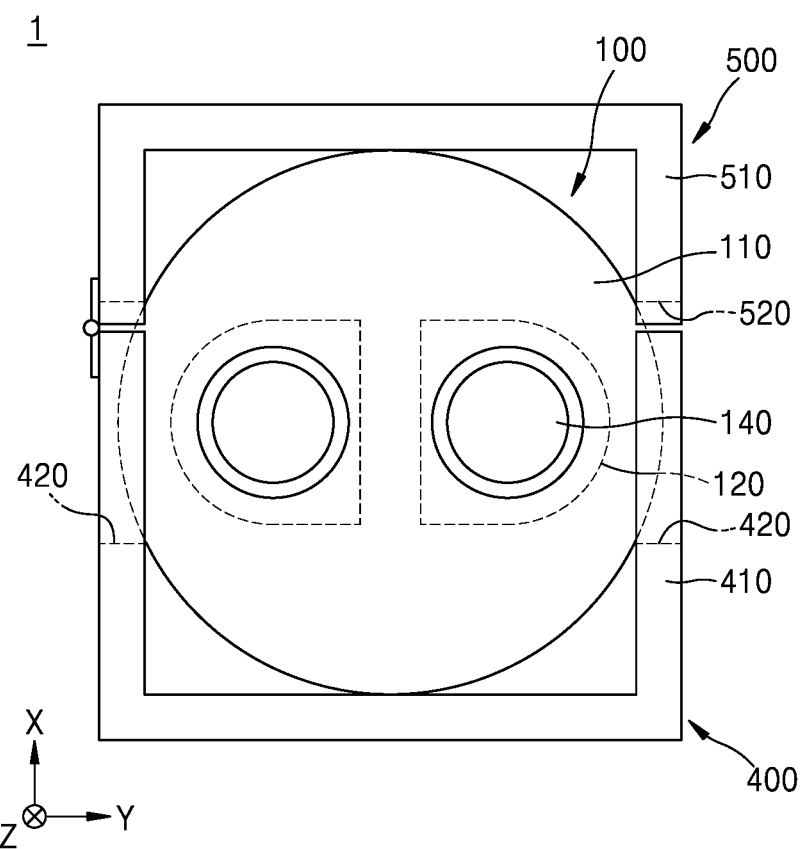
FIG. 4 is a side view illustrating a filament alignment device with a closed auxiliary case body, according to an embodiment.

FIG. 1 is a view illustrating a filament alignment device 1 with an open auxiliary case body, according to an embodiment. FIG. 2 is a view illustrating a filament alignment device 1 with a closed auxiliary case body, according to an embodiment. FIG. 3 is a side cross-sectional view illustrating a filament alignment device 1 with a closed auxiliary case body, according to an embodiment. FIG. 4 is a side view illustrating a filament alignment device 1 with a closed auxiliary case body, according to an embodiment.

Referring to FIGS. 1 to 4, a filament alignment device 1 according to an embodiment may include a plasma flood gun (PFG) 100 including a filament 200 at one end and a support plate 110, a main case 400 configured to accommodate an insulator to be described later, a height adjuster 300 penetrating through an upper wall of the main case 400, and an auxiliary case 500 configured to cover an opened side surface of the main case 400 and to accommodate the PFG 100 together with the main case 400.

The PFG 100 may include the filament 200 that emits electrons, a connection pin 130 with a groove into which an end of the filament 200 is inserted, an insulator 120 on which the connection pin 130 is provided, the support plate 110 having a surface on which the insulator 120 is provided, and a filament fixing member 140.

The main case 400 may include a main case body 410, a first plate groove 420 provided on an open side of the main case body 410, and a first guide key 430 spaced apart from the first plate groove 420 and provided on the open side of the main case body 410.

The height adjuster 300 may include a height controller 310, an extension member 320 that increases or decreases in length by the height controller 310, and a fixing hook 330 provided at an end portion of the extension member 320.

The auxiliary case 500 may include an auxiliary case body 510, a second plate groove 520 provided on the auxiliary case body 510, and a second guide key 530 provided on the auxiliary case body 510 and spaced apart from the second plate groove 520.

The first plate groove 420 may be provided with the main case 400 and a peripheral portion of the support plate 110 of the PFG 100 may be partially inserted into the first plate groove 420. The first plate groove 420 may be provided on the sidewall of the main case body 410 adjacent to the open side surface of the main case 400 among the side surfaces in the main case body 410 of the main case 400. Herein, the side surface of the main case 400 refers to a surface defined by an X direction or a Y direction with reference to the PFG 100 accommodated in the main case 400. In an embodiment, the side surface may include a virtual surface. Herein, the sidewall refers to a wall arranged in the X direction or the Y direction with reference to the PFG 100 accommodated in the main case 400.

Herein, the open side surface of the main case 400 refers to the side surface where the accommodated PFG 100 is exposed to the outside with reference to the PFG 100. That is, the PFG 100 may be accommodated in the main case 400 through the open side surface of the main case 400. In addition, a lower surface of the main case 400 refers to a surface in a −Z direction where the filament fixing member 140 of the PFG 100 is exposed with reference to the inside of the main case body 410. The lower surface of the main case 400 may be referred to as an opening lower surface of the main case 400.

As shown in FIG. 1, the first plate groove 420 may be provided to penetrate through the sidewall of the main case body 410. Alternatively, the first plate groove 420 may be provided as a concave groove concaved inside the sidewall rather than penetrating through the sidewall of the main case body 410. The first plate groove 420 may be provided on the sidewall of the main case body 410 and have a width in the Y direction that is substantially the same as a thickness of the support plate 110 in the Z direction. The first plate groove 420 may have a height in the Z direction that is greater than the thickness of the support plate 110 in the Z direction. The difference in height in the Z direction between the first plate groove 420 and the support plate 110 may be approximately 0.001 mm. In an embodiment, the support plate 110 may be inserted into and fixed to the first plate groove 420 by the filament alignment device 1.

The second plate groove 520 may be provided with the auxiliary case 500 and a peripheral portion of the support plate 110 of the PFG 100 may be partially inserted into the second plate groove 520. In an embodiment, the second plate groove 520 may be provided on two sidewalls facing each other in the auxiliary case body 510 of the auxiliary case 500.

A pair of first plate grooves 420 may be provided on each of the opposite sidewalls of the main case body 410, respectively. A pair of second plate grooves 520 may be provided on each of the opposite sidewalls of the auxiliary case body 510.

In an embodiment, the auxiliary case 500 may be opened and closed with respect to the main case 400 by a hinge 540 connecting the main case 400 with the auxiliary case 500. The hinge 540 may be attached to an outer surface of a sidewall of the main case 400 and an outer surface of a sidewall of the auxiliary case 500, so that the main case 400 and the auxiliary case 500 may be rotatably connected.

When the auxiliary case 500 is closed, the auxiliary case 500 may cover an open side surface of the main case 400. Hereinafter, when the auxiliary case 500 covers the open side surface of the main case 400, the auxiliary case 500 may be referred to as 'closed'. FIG. 2 illustrates a closed state in which the auxiliary case 500 is closed, according to an embodiment. In contrast, when the auxiliary case 500 does not cover the open side surface of the main case 400 and the main case 400 is not closed by the auxiliary case 500, the auxiliary case 500 may be referred to as opened'.

As described above, the peripheral portion of the support plate 110 may be partially inserted into the first plate groove 420. When the auxiliary case 500 is closed, the peripheral portion of the support plate 110 may be fitted into the second plate groove 520 that is provided with the auxiliary case 500. The first plate groove 420 and the second plate groove 520 may have substantially the same height in the Z direction and substantially the same width in the Y direction. When the auxiliary case body 510 contact the main case body 410, and thus, the auxiliary case 500 is closed, the first plate groove 420 and the second plate groove 520 may extend to form a single plate groove and the peripheral portion of the support plate 110 may be partially inserted into the plate groove and be fixed to the main case body 410. the first plate groove 420 may be spaced apart from the lower surface of the main case 400 by about 1 mm to about 5 mm. For example, the first plate groove 420 may be spaced apart from the lower end portion of the main case 400 in the Y direction by about 1 mm to about 5 mm.

As the auxiliary case 500 is closed, the first guide key 430 and the second guide key 530 may be engaged with each other to be coupled. The first guide key 430 may be provided on the sidewall of the main case body 410. The second guide key 530 may be provided on the sidewall of the auxiliary case body 510.

The first guide key 430 may protrude from the sidewall of the main case body 410 in the +X direction. When the first guide key 430 is protruded from the main case body 410, the second guide key 530 may be provided on the sidewall of the auxiliary case body 510 as a groove through which the first guide key 430 is engaged. Alternatively, the second guide key 530 may protrude from the sidewall of the auxiliary case body 510 in the +X direction. When the second guide key 530 is protruded from the auxiliary case body 510, the first guide key 430 may be provided on the sidewall of the main case body 410 as a groove through which the second guide key 530 is engaged.

When the auxiliary case 500 is closed, the main case 400 and the auxiliary case 500 may be combined by the hinge 540, the first guide key 430, the second guide key 530, and the first plate groove 420 and the second plate groove 520 engaged with the support plate 110. When the auxiliary case 500 is closed and the main case 400 and the auxiliary case 500 are combined, the PFG 100 accommodated in the main case 400 may be fixed. Further, when the auxiliary case 500 is closed, the filament fixing member 140, which protrudes from the support plate 110, may be arranged outside the main case body 410, except for a portion corresponding to a space of about 1 mm to about 5 mm.

The PFG 100 may be fixed by the first plate groove 420 and the second plate groove 520. Since the first plate groove 420 and the second plate groove 520 have substantially the same size as the thickness of the support plate 110, the support plate 110 may be inserted into the first plate groove 420 and the second plate groove 520. Accordingly, the PFG 100 and the support plate 110 may be fixed by the first plate groove 420 and the second plate groove 520.

When the auxiliary case 500 is closed, the main case 400 and the auxiliary case 500 may be fixed by the hinge 540. When the auxiliary case 500 is closed, the first guide key 430 and the second guide key 530 are complementarily coupled, and thus, the main case 400 and the auxiliary case 500 may be fixed to each other.

As illustrated in FIG. 1, the sidewalls of the main case body 410 (e.g., interior side surfaces of the main case body 410), located on left and right sides of the insulator 120, may be spaced apart from the insulator 120. Alternatively, the sidewalls of the main case body 410 (e.g., interior side surfaces of the main case body 410), located on the left and right sides of the insulator 120, may contact the insulator 120. When the sidewalls of the main case body 410 (e.g., interior side surfaces of the main case body 410) on the left and right sides of the insulator 120 contact the insulator 120, the PFG 100 may be more stably fixed by the sidewalls of the main case body 410 on the left and right sides of the insulator 120. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting," "in contact with," or "contact" another element, there are no intervening elements present at the point of contact When the auxiliary case 500 is closed, the PFG 100 may be fixed to the main case 400 and the auxiliary case 500 by the hinge 540, the first guide key 430, the second guide key 530, and the first plate groove 420 and the second plate groove 520 engaged with the support plate 110. Accordingly, as described hereinafter, an error of a first height L1 of the filament 200 may be reduced and the filament 200 may be coupled to the PFG 100 with reduced error of the first height L1.

The height adjuster 300 may include the height controller 310 penetrating through an upper sidewall of the main case 400, the extension member 320 protruding from the height controller 310 and extending into the main case, and the fixing hook 330 provided at an end of the extension member 320 in the main case 400. In an embodiment, the height controller 310 and the extension member 320 may be a micrometer. Herein, the micrometer is disclosed as an example of the height controller 310 and the extension member 320, but the height controller 310 and the extension member 320 are not limited to the micrometer.

The height controller 310 may control a protrusion length of the extension member 320. Since the fixing hook 330 is protruded from the end portion of the extension member 320 in the main case 400, the position of the fixing hook 330 in the Z direction may be controlled by the height controller 310. The filament 200, which is provided at an end of the accommodated PFG 100, may be put on the fixing hook 330, to thereby fix the filament 200. In an embodiment, the fixing hook 330 may have a curved J-shape to fix an end of the filament 200.

The fixing hook 330 may be configured to be rotatable with respect to the extension member 320. The extension member 320 may also be rotated according to the use of the height controller 310 for controlling height. Unlike the extension member 320, the filament 200 may be fixed to the main case 400. The filament 200 may be inserted into and fixed to an end portion of the connection pin 130. A height from the end portion of the connection pin 130 into which the filament 200 is inserted to the top of the filament 200 that is protruded in the +Z direction may be referred to as the first height L1.

The fixing hook 330 may be configured not to rotate with respect to the filament 200, and thus, the filament 200 may be put on and fixed to the fixing hook 330 irrespective of the rotation of the extension member 320, even though the extension member 320 is rotated by the operation of the height adjuster 300 for adjusting the first height L1. For example, the fixing hook 330 may be configured to rotate at the end portion of the extension member 320 independent from the rotation of the extension member 320.

The fixing hook 330 may be configured to rotate with respect to a longitudinal direction (Z direction) of the height controller 310. The fixing hook 330 may be rotated separately from rotation of the height controller 310 and/or the extension member 320. Therefore, although the extension member 320 and/or the height controller 310 rotate in controlling the first height L1 by the height controller 310, the filament 200 may be prevented from releasing out of the fixing hook 330.

The filament 200 may protrude from the end portion of the connection pin 130 by the first height L1. The first height L1 may be adjusted by the height adjuster 300. The filament 200 may be fixed by the fixing hook 330, and the position of the extension member 320 may be adjusted by the height controller 310. The first height L1 may be set to a certain value by the height adjuster 300, and then, the filament 200 may be fixed at the first height L1. The filament 200 may be fixed to the PFG 100 by the filament fixing member 140. For example, the filament 200 may be fixed to the PFG by rotating the filament fixing member 140.

The length by which the filament 200 may be inserted into the connection pin 130 may be limited by configurations of the filament 200. Thus, the position of the extension member 320 may be adjusted by the height adjuster 300, and the range of the adjustable position of the extension member 320 may be limited. Due to the above limitations and the length limitation of the filament 200, the first height L1, which is the level difference in the +Z direction between an end of the filament 200 and the connection pin 130, may be limited in a range. In an embodiment, the first height L1 may be adjusted within a range of about 10 mm to about 30 mm. The range of the first height L1 may vary depending on the specifications of the filament 200, the height adjuster 300, and the PFG 100 including the connection pin 130.

The filament alignment device 1 according to an embodiment may detect the first height L1. A change in the first height L1 of the filament 200 may be detected by the height controller 310 of the height adjuster 300. When the height controller 310 detects the change of the first height L1 of the filament 200 based on a specific height of the filament 200, the first height L1 may be detected by the filament alignment device 1.

When the filament 200 is fixed to the PFG by rotating the filament fixing member 140, the first height L1 of the filament 200 may be varied. However, according to the filament alignment device 1, since the filament 200 may be fixed by the fixing hook 330, no variation may occur in the height of the filament 200 in fixing the filament 200 by using the filament fixing member 140. Accordingly, the first height L1 may be precisely set to a preset height value. In an embodiment, the height controller 310 may include a micrometer. For example, the filament 200 may be precisely fixed to the PFG 100 in an error range of generally less than about 0.05 mm in the first height L1 by the height adjuster 300 that is configured to include the micrometer. Accordingly, the height controller 310 may be configured to control the first height L1 by a unit of 0.05 mm in a range of 10 mm to 30 mm.

The PFG 100 may emit a large number of electrons when operated in the ion implantation device. Emitting a large number of electrons may be referred to as emission current. The emission current of the PFG 100 is greatly affected by the height of the filament 200. The distribution of the emission current needs to be adjusted to an appropriate range for a proper yield of the process results. The height of the filament 200 may be accurately adjusted by the filament alignment device 1 according to an embodiment. The filament 200 may be fixed at an optimal height by accurate height adjustment of the filament 200. The range of distribution of the emission current may be reduced by fixing the filament 200 at an accurate height. Accordingly, the yield of the process results may be improved by the filament alignment device 1 according to an embodiment.

When the PFG 100 operates in the ion implantation apparatus, the frequency of the filament 200 breaking may vary depending on the height of the filament 200. As described above, when there is an error in the height of the filament 200, the range of distribution of the emission current is likely to be out of the appropriate range and the filament 200 is also likely to be broken. However, the height of the filament 200 may be accurately adjusted by the filament alignment device 1 according to an embodiment. Thus, the filament 200 may be fixed at an optimal height by accurately adjusting the height of the filament 200. Therefore, the breaking of the filament 200 may be reduced or prevented in operating the PFG 100 in the ion implantation apparatus. Furthermore, the filament alignment device 1 may also reduce interlocks between processes, to thereby improve process efficiency.

Figure 5:
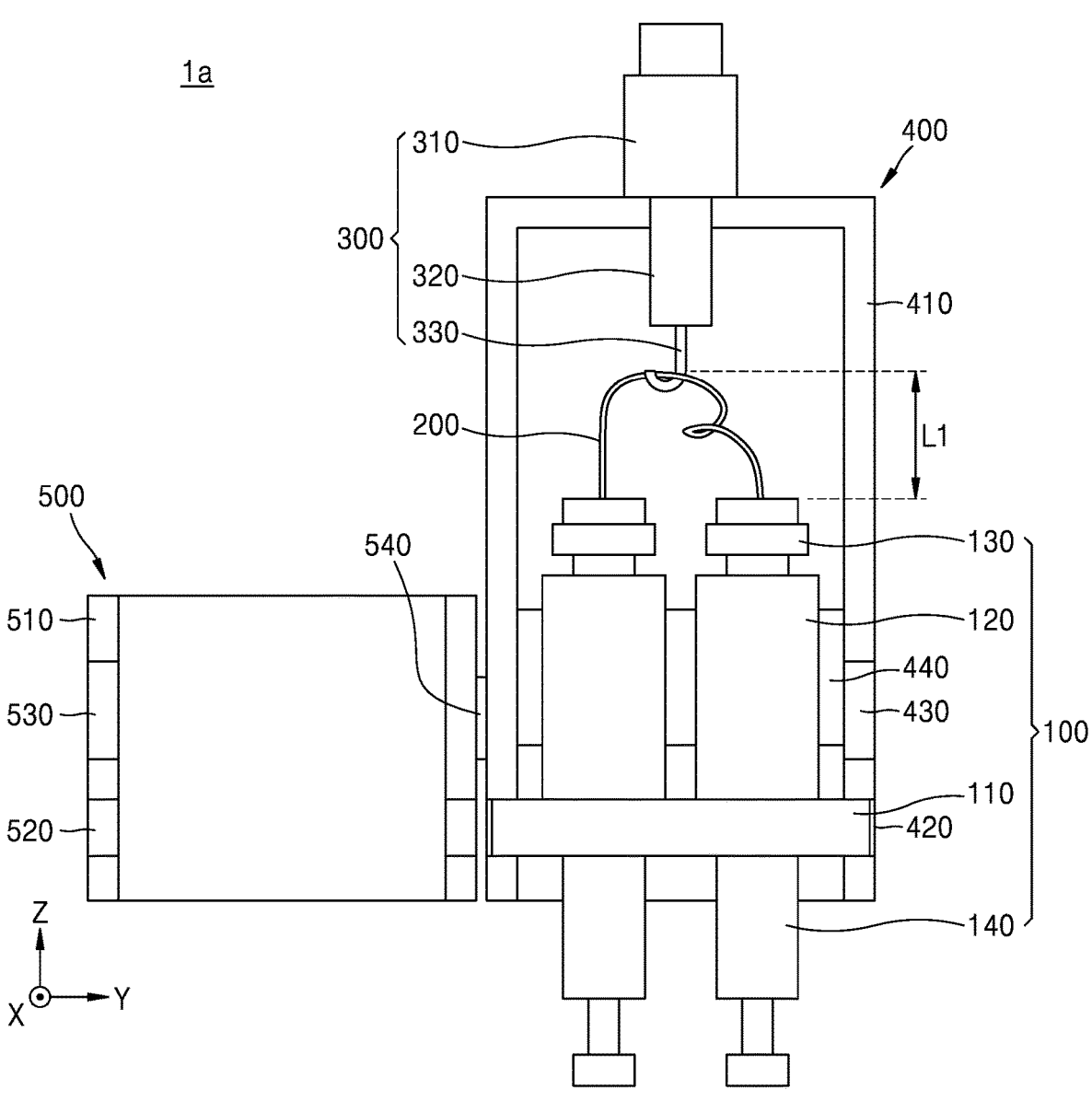
FIG. 5 is a plan view illustrating a filament alignment apparatus with an open auxiliary case body, according to an embodiment.
Figure 6:
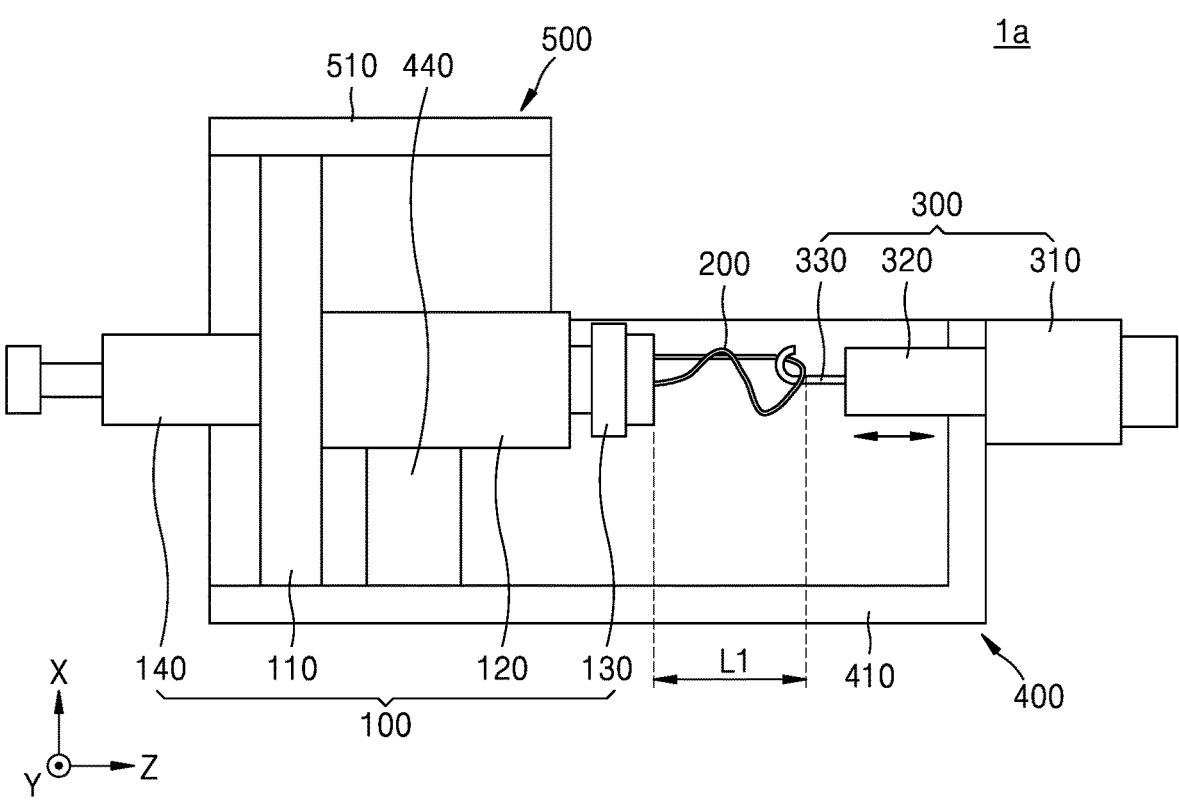
FIG. 6 is a side cross-sectional view illustrating a filament alignment apparatus with a closed auxiliary case body, according to an embodiment.
Figure 7:
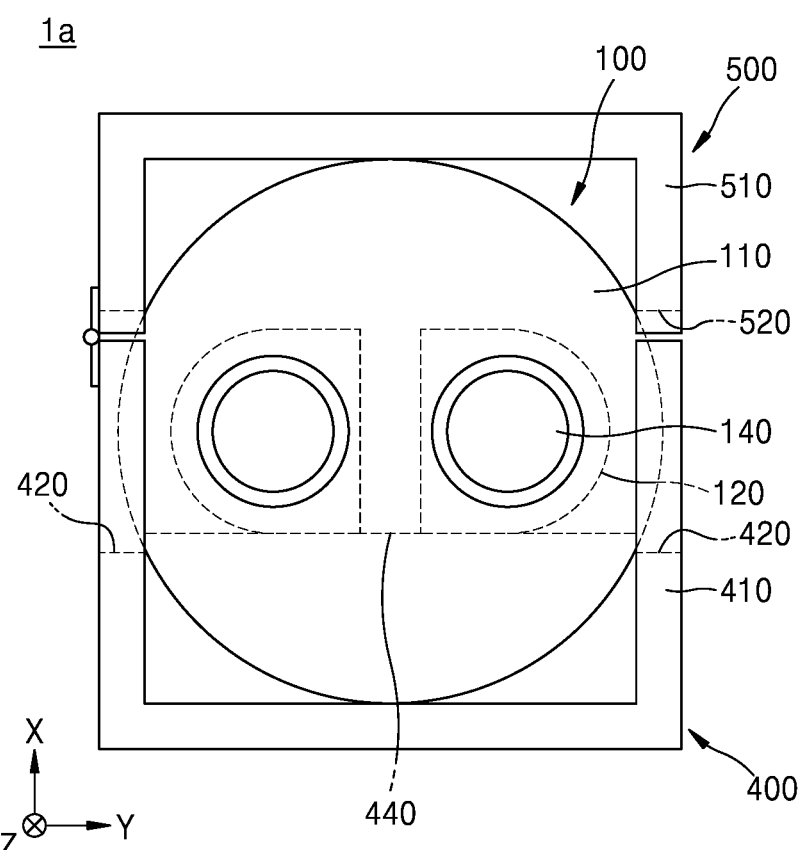
FIG. 7 is a side view illustrating a filament alignment apparatus with a closed auxiliary case body, according to an embodiment.

FIG. 5 is a plan view illustrating a filament alignment apparatus 1a with an open auxiliary case body 500 according to an embodiment. FIG. 6 is a side cross-sectional view illustrating a filament alignment apparatus 1a with a closed auxiliary case body 500 according to an embodiment. FIG. 7 is a side view illustrating a filament alignment apparatus 1a with a closed auxiliary case body 500 according to an embodiment. Descriptions similar to those described above are omitted below for brevity.

Referring to FIGS. 5 to 7, the main case 400 may further include an insulator support 440. The insulator support 440 may be provided on a side surface in the main case body 410. When the PFG 100 is accommodated in the main case 400, the insulator support 440 may be in contact with the insulator 120. In an embodiment, two insulators 120 may be provided on the support plate 110, and two connection pins 130 fixing two end portions of the filament 200 may be provided on the two insulators 120.

As described above, when the auxiliary case body 510 contacts the main case body 410 and the auxiliary case 500 is closed, the first plate groove 420 and the second plate groove 520 may extend to form a single plate groove, and the peripheral portion of the support plate 110 may be partially inserted into the plate groove, and as a result, the support plate 110 may be fixed in the plate groove. In an embodiment, the filament alignment device 1a may be in contact with two side surfaces of the insulator 120, which is provided on the support plate 110, by the insulator support 440. The support plate 110 may be fixed by the first plate groove 420 and the second plate groove 520, and the insulator 120, which is integrated with the support plate 110, may be fixed by the insulator support 440, and as a result, the PFG 100 may not be rotated. Therefore, the PFG 100 is fixed to the filament alignment device 1a according to an embodiment, and the first height L1 of the filament 200 may be precisely set at a height value by the height adjuster 300.

Therefore, the yield of the process result may be improved by the filament alignment device 1a according to an embodiment. In addition, the breaking of the filament 200 may be reduced or prevented in operating the PFG 100 in the ion implantation apparatus, and the interlocks between processes may also be reduced, to thereby improve process efficiency.

Figure 8:
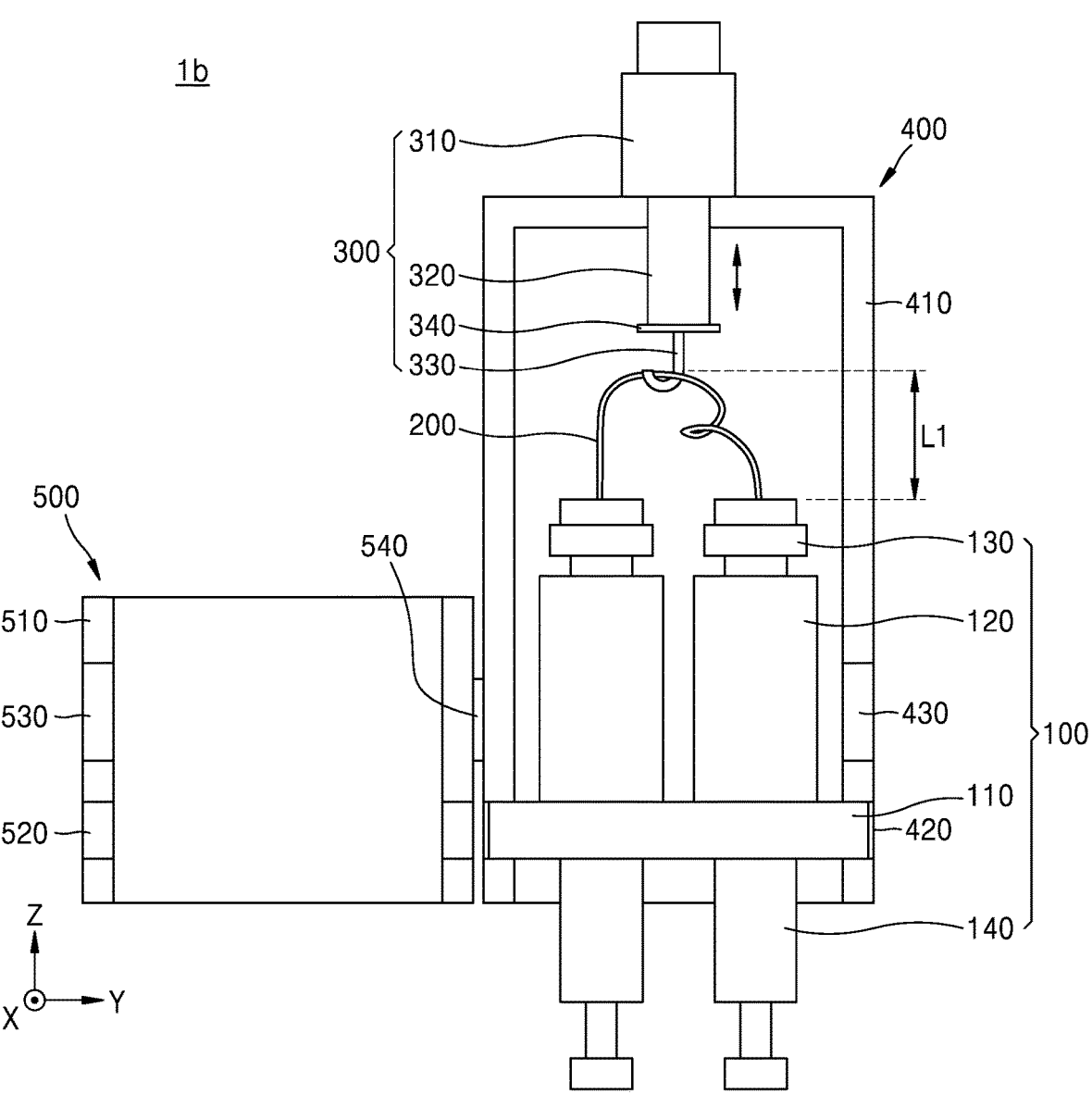
FIG. 8 is a plan view illustrating a filament alignment device with an open auxiliary case body, according to an embodiment.

FIG. 8 is a plan view illustrating a filament alignment device 1b with an open auxiliary case body 500 according to an embodiment. Descriptions similar to those described above are omitted below for brevity.

Referring to FIG. 8, the height adjuster 300 may further include a magnet 340. As described above, the fixing hook 330 may be configured to be rotatable with respect to the extension member 320 independently from the extension member 320. In an embodiment, in the filament alignment device 1b, the magnet 340 may be attached to the end portion of the extension member 320 on one (e.g., first) surface by a magnetic force. A fixing hook 330 may be attached to the other (e.g., second) surface of the magnet 340, which is opposite to the one surface in contact with the extension member 320, by the magnetic force. The fixing hook 330 may be attached by magnetic force such that as long as an excessive force is not applied to the fixing hook 330 downwards, the fixing hook 330 may not be detached from the surface of the magnet 340 by magnetic force. However, since the fixing hook 330 is not completely fixed to the surface of the magnet 340 like e.g., a mechanical joint, the fixing hook 330 may be rotated on the surface of the magnet 340 around the Z direction.

Due to the use of the height adjuster 300 for adjusting the first height L1, the extension member 320 and the magnet 340 attached to the extension member 320 may rotate together. Apart from the rotation of the extension member 320, the fixing hook 330 may be configured not to rotate against the filament 200 in order for the fixing hook 330 to fix the filament 200. Therefore, the fixing hook 330 may be configured to rotate independently from the extension member 320 and the magnet 340. The filament 200 may be fixed to the fixing hook 330, and the position of the extension member 320 may be adjusted using the height adjuster 300. The first height L1 may be set to a preset value by the height adjuster 300, and the filament 200 may be fixed at the first height L1. The filament 200 may be fixed by the filament fixing member 140.

According to an embodiment of the filament alignment device 1b, since the filament 200 may be fixed by the fixing hook 330, no variation may occur in the height of the filament 200 in fixing the filament 200 by using the filament fixing member 140. Accordingly, the first height L1 may be precisely set to a preset height value.

Figure 9:
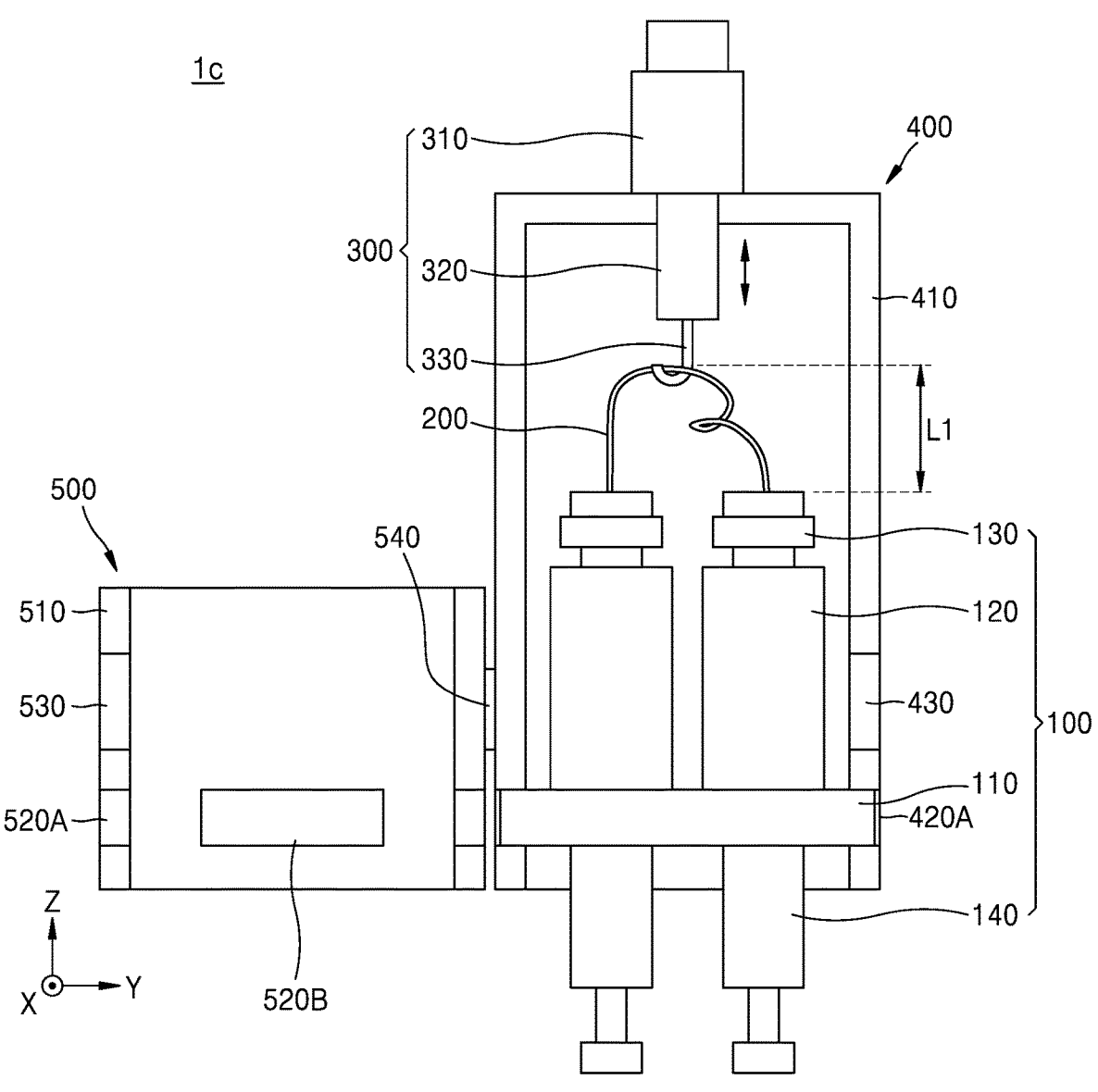
FIG. 9 is a plan view illustrating a filament alignment device with an open auxiliary case body, according to an embodiment.
Figure 10:
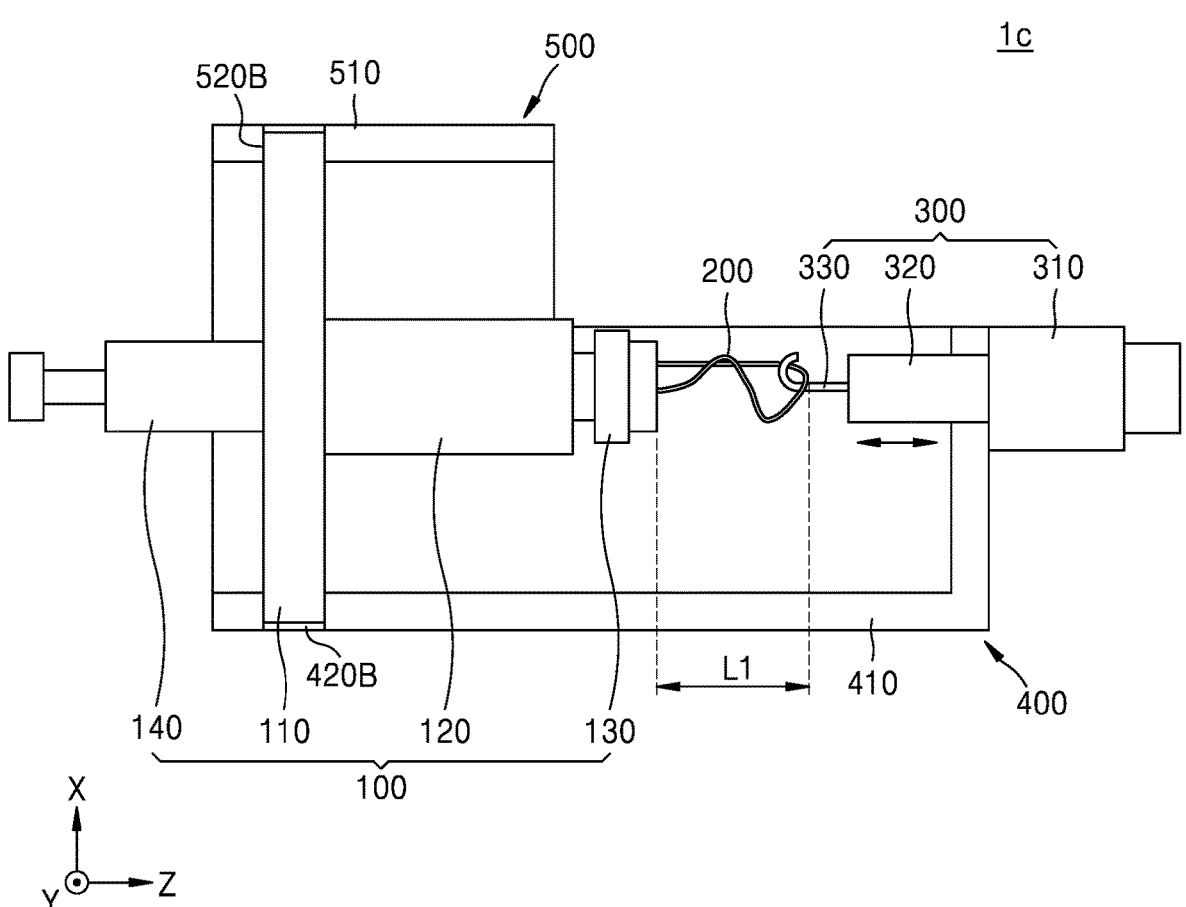
FIG. 10 is a side cross-sectional view illustrating a filament alignment device with a closed auxiliary case body, according to an embodiment.
Figure 11:
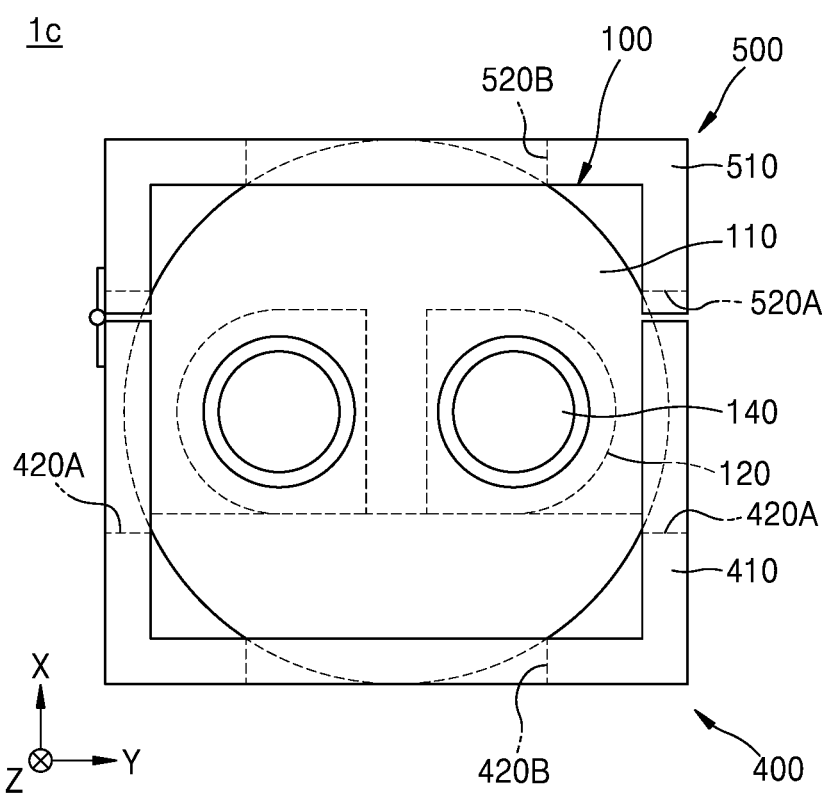
FIG. 11 is a side view illustrating a filament alignment device with a closed auxiliary case body, according to an embodiment.

FIG. 9 is a plan view illustrating a filament alignment device 1c with an open auxiliary case body 500 according to an embodiment. FIG. 10 is a side cross-sectional view illustrating a filament alignment device 1c with a closed auxiliary case body 500, according to an embodiment. FIG. 11 is a side view illustrating a filament alignment device 1c, with a closed auxiliary case body 500 according to an embodiment. Descriptions similar to those described above are omitted below for brevity.

Referring to FIGS. 9 to 11, first plate grooves 420A and 420B may be provided on sidewalls of the main case body 410. A pair of sidewall first plate grooves 420A may be provided on two sidewalls, which faces each other, of the main case body 410. A base first plate groove 420B may be provided on a remaining sidewall of three sidewalls except for two sidewalls on which the pair of sidewall first plate grooves 420A are provided in the main case 400.

As shown in FIGS. 9 and 10, the first plate grooves 420A and 420B may penetrate through the sidewalls of the main case body 410. Alternatively, unlike FIG. 9, the first plate grooves 420A and 420B may be provided as concave grooves concaved inside the sidewall rather than penetrating through the sidewall of the main case body 410. The first plate grooves 420A and 420B may be provided on the sidewalls of the main case body 410. The first plate groove 420A may have a width in the Y direction that is substantially the same as a thickness of the support plate 110 in the Z direction. The first plate groove 420B may have a width in the X direction that is substantially the same as a thickness of the support plate 110 in the Z direction. The first plate grooves 420A and 420B may have a height in the Z direction that is greater than the thickness of the support plate 110 in the Z direction. The difference in height in the Z direction between the first plate groove 420A (or the first plate groove 420B) and the support plate 110 may be approximately 0.001 mm. In an embodiment, the support plate 110 may be inserted into and fixed to the first plate grooves 420A and 420B by the filament alignment device 1c.

The auxiliary case 500 may include second plate grooves 520A and 520B. A pair of sidewall second plate grooves 520A of the second plate grooves 520A and 520B may be provided on two sidewalls facing each other among side surfaces in the auxiliary case body 510 of the auxiliary case 500. A base second plate groove 520B may be provided on a remaining sidewall of the three sidewalls of the auxiliary case body 510 except for the other two sidewalls on which the pair of sidewall second plate grooves 520A are provided.

As shown in FIG. 9, the second plate grooves 520A and 520B may penetrate through the sidewalls of the auxiliary case body 510. Alternatively, unlike the illustration in FIG. 9, the second plate grooves 520A and 520B may be provided as concave grooves concaved inside the sidewall rather than penetrating through the sidewall of the auxiliary case body 510. The second plate grooves 520A and 520B may be provided on the sidewalls of the auxiliary case body 510. The second plate groove 520A may have a width in the Y direction that is substantially the same as a thickness of the support plate 110 in the Z direction. The second plate groove 520B may have a width in the X direction that is substantially the same as a thickness of the support plate 110 in the Z direction. The second plate grooves 520A and 520B may have a height in the Z direction that is greater than the thickness of the support plate 110 in the Z direction. The difference in height in the Z direction between the second plate groove 520A (or the second plate groove 520B) and the support plate 110 may be approximately 0.001 mm. In an embodiment, the support plate 110 may be inserted into and fixed to the second plate grooves 520A and 520B by the filament alignment device 1c.

When the auxiliary case 500 is closed, the PFG 100 including the support plate 110 may be fixed by the first plate grooves 420A and 420B and the second plate grooves 520A and 520B. For example, when the auxiliary case 500 is closed, the main case 400 and the auxiliary case 500 may be combined with each other by the hinge 540, the first guide key 430, the second guide key 530, and the first plate grooves 420A and 420B and the second plate grooves 520A and 520B engaged with the support plate 110. When the auxiliary case 500 is closed and the main case 400 is combined with the auxiliary case 500, the PFG 100 accommodated in the main case 400 may be fixed.

According to an embodiment of the filament alignment device 1c, since the support plate 110 is inserted and fixed in four directions by the first plate grooves 420A and 420B and the second plate grooves 520A and 520B, the filament 200 may be precisely installed to the PFG 100 at a preset height value.

Figure 12:
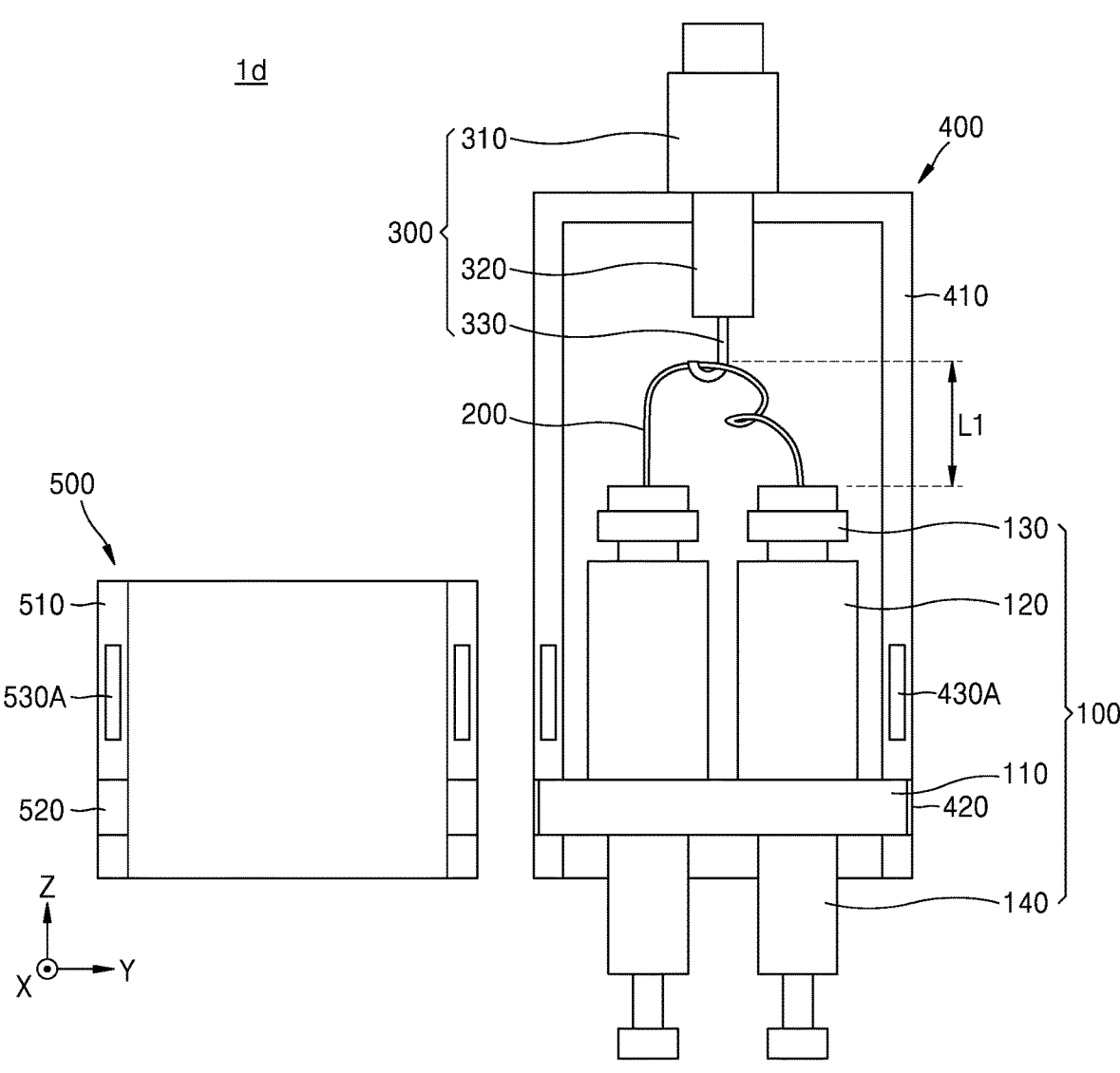
FIG. 12 is a plan view illustrating a filament alignment device with a detached auxiliary case body, according to an embodiment.

FIG. 12 is a plan view illustrating a filament alignment device 1d with a detached auxiliary case body, according to an embodiment. The same descriptions as described above are omitted within an overlapping range.

Referring to FIG. 12, the main case 400 and the auxiliary case 500 may not be connected to each other, for example, by a hinge. In an embodiment, the auxiliary case 500 may cover the open side surface of the main case 400 in a state that the PFG 100 is accommodated in the main case 400, so that the PFG 100 is fixed to the main case 400 by the combination of the main case 400 and the auxiliary case 500.

A pair of first guide keys 430A may be provided on two opposite sidewalls of the main case body 410, respectively. A pair of second guide keys 530A may be provided on two opposite sidewalls of the auxiliary case body 510, respectively.

The first guide key 430A may protrude from the sidewall of the main case body 410 in the +X direction. When the first guide key 430A protrudes from the sidewall of the main case body 410, the second guide key 530A may be provided on the sidewall of the auxiliary case body 510 as a groove through which the first guide key 430A may be complementarily engaged with the second guide key 530A. Alternatively, the second guide key 530A may protrude from the sidewall of the auxiliary case body 510 in the +X direction. When the second guide key 530A protrudes from the sidewall of the auxiliary case body 510, the first guide key 430A may be provided on the sidewall of the main case body 410 as a groove that may be complementarily engaged with the second guide key 530A.

When the auxiliary case 500 is closed, the main case 400 and the auxiliary case 500 may be combined by the first guide key 430 and the second guide key 530, and the first plate grooves 420 and the second plate grooves 520 engaged with the support plate 110. When the auxiliary case 500 is closed and the main case 400 is combined with the auxiliary case 500, the PFG 100 accommodated in the main case 400 may be fixed in the main case 400. Thus, the PFG 100 may be fixed in the main case 400 by reduced error between a preset height value of the filament 200 and the actually set first height L1.

Although embodiments of the technical idea of this invention have been described with reference to the accompanying drawings, those of ordinary skill in the art will understand that aspects of the invention may be implemented in other specific shapes without changing its technical idea or essential features. Therefore, the embodiments described above are exemplary in all respects and should not be understood as limited.

While aspects the inventive concept has been particularly shown and described with reference to embodiments thereof, it will be understood that various changes in form and details may be made therein without departing from the spirit and scope of the following claims.

What is claimed is:

1. A filament alignment device for accommodating a plasma flood gun (PFG) including a support plate, an insulator on the support plate, and a filament installed at an end portion of the insulator, the filament alignment device comprising:
a main case having, in a sidewall, a first plate groove into which a first portion of the support plate is inserted, and an open side surface;
an auxiliary case covering at least a first area of the open side surface of the main case, and having, in a sidewall, a second plate groove into which a second portion of the support plate is inserted;
a height adjuster including a height controller arranged on an upper sidewall of the main case and a fixing hook that is provided on an end portion of the height controller and on which the filament is hung; and
a hinge rotatably connecting the sidewall of the auxiliary case with the sidewall of the main case such that the auxiliary case is opened and closed with respect to the main case.

2. The filament alignment device of claim 1, wherein the fixing hook rotates independently from rotation of the height adjuster.

3. The filament alignment device of claim 1, wherein the height adjuster further includes a magnet having a first surface onto which an end portion of the height controller is attached by a magnetic force, and a second surface opposite to the first surface and onto which the fixing hook is attached by the magnetic force.

4. The filament alignment device of claim 1, wherein the main case includes a first guide key on the open side surface of the main case, and the auxiliary case includes a second guide key that is complementarily engaged with the first guide key.

5. The filament alignment device of claim 4, wherein the hinge connects another sidewall of the main case facing the sidewall on which the first guide key is provided with another sidewall of the auxiliary case facing the sidewall on which the second guide key is provided.

6. The filament alignment device of claim 4, wherein the first plate groove is spaced apart from a lower surface of the main case in a range of 1 mm to 5 mm.

7. The filament alignment device of claim 1, wherein the first plate groove is provided on two opposite sidewalls of the main case, and the second plate groove is provided on two opposite sidewalls of the auxiliary case.

8. The filament alignment device of claim 1, wherein the first plate groove is provided in three sidewalls of the main case, and the second plate groove is provided in three sidewalls of the auxiliary case.

9. The filament alignment device of claim 1, wherein the height controller includes a micrometer.

10. The filament alignment device of claim 9, wherein the height controller controls a first height, which is a height of an exposed portion of the filament, by a unit of 0.05 mm in a range of 10 mm to 25 mm.

11. The filament alignment device of claim 1, wherein the auxiliary case covers a first area of the open side surface of the main case and the filament of the PFG is exposed at a second area of the open side surface of the main case to the surroundings.

12. The filament alignment device of claim 1, wherein a lower portion of the main case opposite to the upper sidewall on which the height adjuster is arranged is opened.

13. The filament alignment device of claim 12, wherein a portion of the PFG protrudes downward from the main case and is exposed.

14. The filament alignment device of claim 1, wherein the main case includes an insulator support therein, and the insulator support contacts the insulator to thereby prevent the PFG from rotating.

15. A filament alignment device for accommodating a plasma flood gun (PFG) including a support plate, an insulator on the support plate, and a filament installed at an end portion of the insulator, the filament alignment device comprising:
a main case having, in a sidewall, a first plate groove into which a first portion of the support plate is inserted, and an open side surface;
an auxiliary case covering at least a first area of the open side surface of the main case, and having, in a sidewall, a second plate groove into which a second portion of the support plate is inserted; and
a height adjuster including a height controller penetrating through an upper sidewall of the main case and a fixing hook that is provided on an end portion of the height controller and on which the filament is hung, wherein a first guide key is provided on each of two opposite sidewalls of the main case, and wherein a second guide key, which is complementarily engaged with the first guide key, is provided on each of two opposite sidewalls of the auxiliary case.

16. The filament alignment device of claim 15, wherein the height controller includes a micrometer, and the fixing hook is provided at one end portion of the micrometer and rotated with respect to an axis directed to a length of the height controller.

17. The filament alignment device of claim 16, wherein the main case further includes an insulator support therein, and the insulator support contacts the insulator to thereby prevent the PFG from rotating.

18. The filament alignment device of claim 15, wherein the height adjuster further includes a magnet, and the magnet includes a first surface onto which an end portion of the height controller is attached by a magnetic force and a second surface opposite to the first surface and onto which the fixing hook is attached by the magnetic force.

19. The filament alignment device of claim 16, wherein a first height, which is a height of an exposed portion of the filament, is adjusted by the height adjuster in a range of 10 mm to 30 mm.

20. A filament alignment device for accommodating a plasma flood gun (PFG) including a support plate, an insulator on the support plate, and a filament installed at an end portion of the insulator, the filament alignment device comprising:

a main case having, in a sidewall, a first plate groove into which a first portion of the support plate is inserted, and a first guide key on an open side surface;

an auxiliary case covering at least a first area of the open side surface of the main case, having, in a sidewall, a second plate groove into which a second portion of the support plate is inserted, and a second guide key complementarily engaged with the first guide key;

a height adjuster including a micrometer on an upper sidewall of the main case, a magnet attached to an end portion of the micrometer by a magnetic force, and a fixing hook attached to the magnet by a magnetic force and on which the filament is hung, the fixing hook rotating independently from a rotation of the micrometer; and a hinge rotatably connecting the sidewall of the auxiliary case with the sidewall of the main case such that the auxiliary case is opened and closed with respect to the main case, wherein the first plate groove is provided on each of two opposite sidewalls of the main case, and the second plate groove is provided on each of two opposite sidewalls of the auxiliary case.

* * * * *